United States Patent
Choi et al.

(10) Patent No.: US 9,324,391 B2
(45) Date of Patent: *Apr. 26, 2016

(54) DUAL EVENT COMMAND

(75) Inventors: Joo S. Choi, Boise, ID (US); Troy A. Manning, Meridian, ID (US); Brent Keeth, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 12/478,270

(22) Filed: Jun. 4, 2009

(65) Prior Publication Data

US 2009/0248970 A1 Oct. 1, 2009

Related U.S. Application Data

(63) Continuation of application No. 11/495,418, filed on Jul. 28, 2006, now Pat. No. 7,549,033, which is a continuation of application No. 10/767,555, filed on Jan. 29, 2004, now Pat. No. 7,299,329.

(51) Int. Cl.
G06F 12/02 (2006.01)
G11C 7/10 (2006.01)
G06F 13/16 (2006.01)

(52) U.S. Cl.
CPC ............ *G11C 7/109* (2013.01); *G06F 12/0207* (2013.01); *G06F 13/1668* (2013.01); *G11C 7/1072* (2013.01); *G11C 7/1078* (2013.01)

(58) Field of Classification Search
CPC .... G11C 7/109; G11C 7/1072; G11C 7/1078; G06F 12/02; G06F 12/0207; G06F 13/1668
See application file for complete search history.

(56) References Cited

U.S. PATENT DOCUMENTS

| | | |
|---|---|---|
| 3,902,163 A | 8/1975 | Amdahl et al. |
| 3,922,644 A | 11/1975 | Borbas et al. |
| 4,061,933 A | 12/1977 | Schroeder et al. |
| 4,360,903 A | 11/1982 | Plachno et al. |
| 4,373,179 A | 2/1983 | Katsumata |
| 4,535,427 A | 8/1985 | Jiang |
| 4,595,845 A | 6/1986 | Briggs |
| 4,649,301 A | 3/1987 | Van Tran |
| 4,774,653 A | 9/1988 | James |
| 4,873,521 A | 10/1989 | Dietrich et al. |
| 5,223,755 A | 6/1993 | Richley |
| 5,604,775 A | 2/1997 | Saitoh et al. |
| 5,666,321 A | 9/1997 | Schaefer |
| 5,811,998 A | 9/1998 | Lundberg et al. |

(Continued)

OTHER PUBLICATIONS

"400 Mb/s/pin SLDRAM, 4M × 18 SLDRAM, Pipelined, Eight Bank, 2.5V Operation", *SLDRAM Inc.*, (1998), 1-69.

(Continued)

*Primary Examiner* — Michael Krofcheck
(74) *Attorney, Agent, or Firm* — Schwegman Lundberg & Woessner, P.A.

(57) ABSTRACT

A technique to increase transfer rate of command and address signals via a given number of command and address pins in each of one or more integrated circuit memory devices during a clock cycle of a clock signal. In one example embodiment, the command and address signals are sent on both rising and falling edges of a clock cycle of a clock signal to increase the transfer rate and essentially reduce the number of required command and address pins in each integrated circuit memory device.

20 Claims, 9 Drawing Sheets

(56) References Cited

U.S. PATENT DOCUMENTS

| | | | |
|---|---|---|---|
| 5,825,710 A * | 10/1998 | Jeng et al. ............... 365/233.1 |
| 5,845,108 A | 12/1998 | Yoo et al. |
| 5,878,235 A | 3/1999 | Porterfield et al. |
| 5,946,260 A | 8/1999 | Manning |
| 5,969,552 A | 10/1999 | Lee |
| 5,973,989 A | 10/1999 | Pawlowski |
| 6,005,823 A | 12/1999 | Martin et al. |
| 6,008,074 A | 12/1999 | Brand |
| 6,029,250 A | 2/2000 | Keeth |
| 6,029,252 A | 2/2000 | Manning |
| 6,094,704 A | 7/2000 | Martin et al. |
| 6,094,727 A | 7/2000 | Manning |
| 6,101,197 A | 8/2000 | Keeth et al. |
| 6,111,812 A | 8/2000 | Gans et al. |
| 6,125,078 A | 9/2000 | Ooishi et al. |
| 6,141,263 A | 10/2000 | Protzman |
| 6,142,830 A | 11/2000 | Loeffler |
| 6,167,495 A | 12/2000 | Keeth et al. |
| 6,172,893 B1 | 1/2001 | Ryan |
| 6,175,894 B1 | 1/2001 | Manning |
| 6,178,133 B1 | 1/2001 | Manning |
| 6,178,488 B1 | 1/2001 | Manning |
| 6,181,616 B1 | 1/2001 | Byrd |
| 6,192,002 B1 | 2/2001 | Merritt |
| 6,195,724 B1 | 2/2001 | Stracovskt et al. |
| 6,209,052 B1 | 3/2001 | Chin et al. |
| 6,243,282 B1 | 6/2001 | Rondeau et al. |
| 6,243,797 B1 | 6/2001 | Merritt |
| 6,256,217 B1 | 7/2001 | Rondeau et al. |
| 6,259,630 B1 | 7/2001 | Kawamura |
| 6,266,734 B1 | 7/2001 | LaBerge |
| 6,266,750 B1 | 7/2001 | DeMone et al. |
| 6,279,090 B1 | 8/2001 | Manning |
| 6,286,062 B1 | 9/2001 | Ryan |
| 6,301,322 B1 | 10/2001 | Manning |
| 6,310,816 B2 | 10/2001 | Manning |
| 6,321,315 B1 | 11/2001 | LaBerge |
| 6,338,127 B1 | 1/2002 | Manning |
| 6,355,985 B1 | 3/2002 | Brand |
| 6,360,292 B1 | 3/2002 | Manning |
| 6,374,360 B1 | 4/2002 | Keeth et al. |
| 6,377,093 B1 | 4/2002 | Lee et al. |
| 6,378,049 B1 | 4/2002 | Stracovsky et al. |
| 6,388,480 B1 | 5/2002 | Stubbs |
| 6,392,951 B2 | 5/2002 | Fujima et al. |
| 6,405,280 B1 | 6/2002 | Ryan |
| 6,405,296 B1 | 6/2002 | Barth et al. |
| 6,412,052 B2 | 6/2002 | Keeth et al. |
| 6,414,903 B1 | 7/2002 | Keeth et al. |
| 6,425,045 B2 | 7/2002 | LaBerge |
| 6,434,684 B1 | 8/2002 | Manning |
| 6,442,644 B1 | 8/2002 | Gustavson et al. |
| 6,445,624 B1 | 9/2002 | Janzen et al. |
| 6,477,631 B1 | 11/2002 | Martin et al. |
| 6,484,244 B1 | 11/2002 | Manning |
| 6,496,440 B2 | 12/2002 | Manning |
| 6,510,474 B1 | 1/2003 | Stracovsky et al. |
| 6,519,675 B1 | 2/2003 | Manning |
| 6,519,689 B2 | 2/2003 | Manning |
| 6,560,669 B1 | 5/2003 | Ryan |
| 6,587,804 B1 | 7/2003 | Johnson et al. |
| 6,621,316 B1 | 9/2003 | Kirsch |
| 6,625,242 B1 | 9/2003 | Yoo et al. |
| 6,636,935 B1 | 10/2003 | Ware et al. |
| 6,647,523 B2 | 11/2003 | Manning |
| 6,697,297 B2 | 2/2004 | Keeth et al. |
| 6,704,881 B1 | 3/2004 | Li et al. |
| 6,706,565 B2 | 3/2004 | Brand |
| 6,724,666 B2 | 4/2004 | Janzen et al. |
| 6,789,155 B2 | 9/2004 | Jeddeloh |
| 6,801,989 B2 | 10/2004 | Johbnson et al. |
| 6,851,032 B2 | 2/2005 | LaBerge et al. |
| 6,934,813 B1 | 8/2005 | Jeddeloh |
| 6,950,893 B2 | 9/2005 | Chan |
| 6,968,026 B1 | 11/2005 | Li et al. |
| 7,055,012 B2 | 5/2006 | LaBerge et al. |
| 7,085,975 B2 | 8/2006 | Manning |
| 7,299,329 B2 | 11/2007 | Choi et al. |
| 7,549,033 B2 | 6/2009 | Choi et al. |
| 2001/0006483 A1 | 7/2001 | Ohshima et al. |
| 2003/0123319 A1 | 7/2003 | Kim |
| 2005/0172095 A1 | 8/2005 | Choi et al. |
| 2006/0265565 A1 | 11/2006 | Choi et al. |

OTHER PUBLICATIONS

"Draft Standard for a High-Speed Memory Interface (SyncLink)", *The Institute of Electrical and Electronics Engineers, Inc*, Draft 0.99 IEEE P1596.7-199X, (1996), 1-55.

"New NEC Memory Technology Increases Performance by 20%", http://www.nb-pacifica.com/headline/newnecmemorytechnolo_ 1144.sh, (1997), 1-2.

"SL-DRAM Protocol and Command Format", Slide Presentation, MOSAID Technologies, Inc., Joint Electron Device Enigineering Council, Maui, (Dec. 11, 1996), 22 slides.

"Virtual Channel Memory", *NEC Electronics Inc.*, (1997), 1-2.

Gillingham, P, "SLDRAM Architectural and Functional Overview", *The SLDRAM Consortium*, (Aug. 1997), 1-14.

* cited by examiner

DUAL EVENT COMMAND

RELATED APPLICATIONS

This application is a Continuation of U.S. application Ser. No. 11/495,418, filed Jul. 28, 2006 now U.S. Pat. No. 7,549,033, which is a Continuation of U.S. application Ser. No. 10/767,555, filed Jan. 29, 2004, now issued as U.S. Pat. No. 7,299,329, which are incorporated herein by reference in their entirety.

FIELD OF THE INVENTION

The present invention relates to memory circuits and, in particular, to circuitry associated with command and address pins of a DRAM (dynamic random access memory).

BACKGROUND OF THE INVENTION

In order to perform data transfers, such as a store and an access, to and from conventional DRAM devices, the command and address signals are generally initiated on a rising edge (the transition from logic level "zero" to "one") or alternatively a falling edge of a clock signal. In a high speed DRAM design, using the current scheme to store and access the data from a DRAM can result in requiring a significantly higher number of command and address pins. Further, any increase in the number of command and address pins, can also result in a significant overhead for the DRAM controller performing data transfers via multiple DRAMs. For example, a DRAM controller coupled to access 8×32DRAMs in a system, parallelly or concurrently, can require nearly 256 bit input/output (I/O) interfaces. Furthermore, for efficient handling of the command and address signals, the DRAM controller may also have to assign a similar number of command and address pins. Therefore, any increase in the number of command and address pins in a DRAM, in the above system, can also result in requiring similar increase in the command and address pins in each DRAM for the DRAM controller. This is because of operating the command and address signals at half cycles and because of using the command and address pins for a single purpose or a single cycle in conventional double data rate (DDR) DRAM devices.

In addition, during the last several decades, memory technology has progressed dramatically. The density of commercial memory devices, such as the DRAM, has increased from 1 Kbit to 256 Mbits per chip, a factor of 256,000. Unfortunately, as the density goes up the number of command and address pins required to store and access data has also increased considerably. Increasing the number of command and address pins can result in a bigger package size for reasons described-above. As the packaging density increases, accommodating more number of command and address pins in a smaller package becomes more difficult.

Accordingly, there is a need in the art for a technique to reduce the number of command and address pins required in DRAMs to perform data transfers to and from the DRAMs.

DETAILED DESCRIPTION OF THE INVENTION

In the following detailed description, reference is made to various specific embodiments in which the invention may be practiced. These embodiments are described with sufficient detail to enable those skilled in the art to practice the invention, and it is to be understood that other embodiments may be employed, and that structural, logical, electrical, and process changes may be made without departing from the teachings of the invention.

In the foregoing description of the preferred embodiments, various features of the invention are grouped together in a single embodiment for the purpose of streamlining the disclosure. This method of disclosure is not to be interpreted as reflecting an intention that the claimed invention requires more features than are expressly recited in each claim. Rather, as the following claims reflect, inventive aspects lie in less than all features of a single disclosed embodiment. Thus, the following claims are hereby incorporated into the description of the preferred embodiments, with each claim standing on its own as a separate preferred embodiment of the invention.

The present invention provides techniques to reduce number of command and address pins required in a DRAM to reduce the package size and to essentially increase the number of command and address signals sent for a given set of command and address pins in the DRAM. The terms "sending" and "initiating" are used interchangeably throughout the document. References to "rising edge" and "falling edge" of a clock or control signal is for illustrative purposes only since those skilled in the art readily know that true or complementary clock and control signals may be used in which a rising edge may be substituted for a falling edge. Therefore, a clock or control signal may substitute any clock transition (rising or falling) and still fall within the scope of this description and claims.

Figure 1:
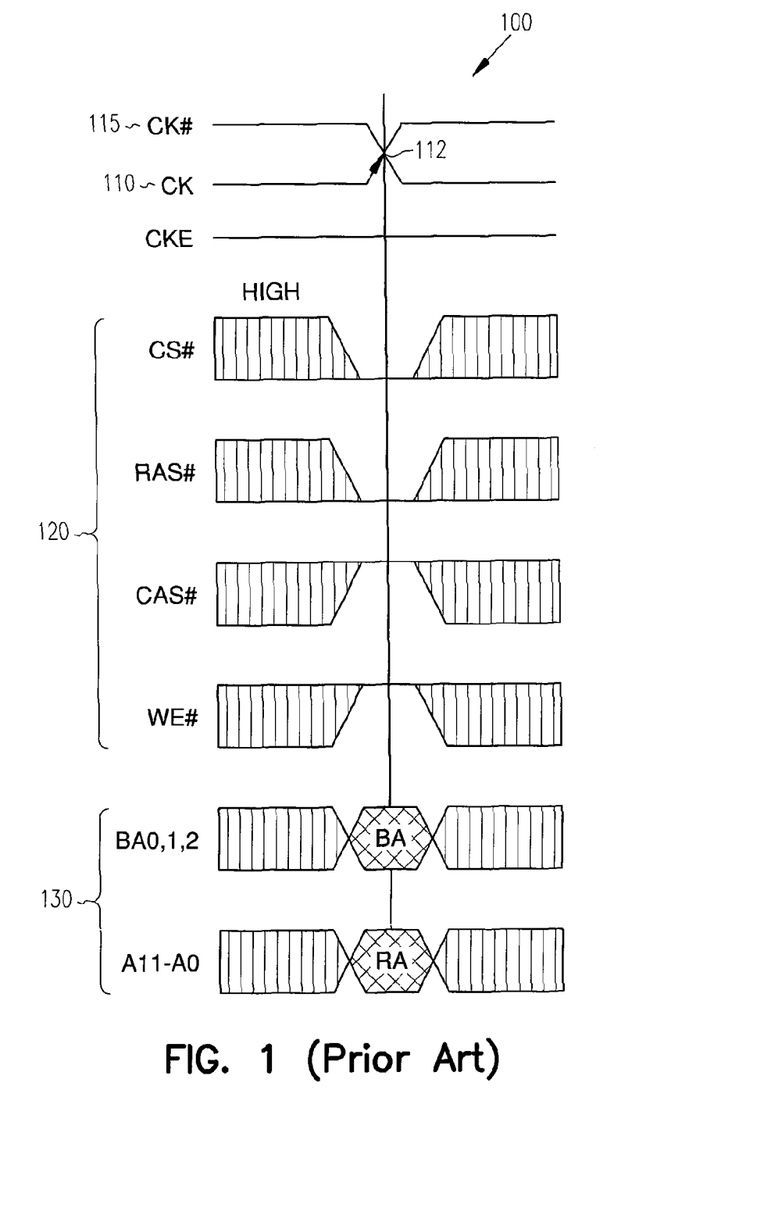
FIG. 1 is a timing diagram illustrating one approach of initiating the command and address signals to transfer data to and from the DRAM upon the rising edge of a clock signal in a conventional DRAM.

Referring now to FIG. 1, there is illustrated one conventional technique employed in initiating command and address signals by a DRAM controller to access data from a DRAM upon the rise (active edge) of a timing signal. As shown in the timing diagram 100 of FIG. 1, the DRAM controller sends the command signals 120, such as Chip Select (CS#), Row Address Strobe (RAS#), Column Address Strobe (CAS#), and Write Enable (WE#) and the address signals 130, such as BA0~2 and A11~A0 during a rising edge 112 of a clock (CK) signal 110. Also shown in FIG. 1 is clock signal (CK#) 115 which is an inverse of the CK signal 110. It can be envisioned that the command and address signals can also be initiated, similarly as described-above, during a falling edge of the CK# signal 115. As described-above, the problem with this technique is as the density of the DRAMs goes up the number of command and address pins required to store and access data can also increase proportionately in each DRAM. Increasing the number of command and address pins can result in a significantly bigger package size. As the packaging density increases, accommodating more number of command and address pins in a smaller package becomes difficult.

Figure 2:
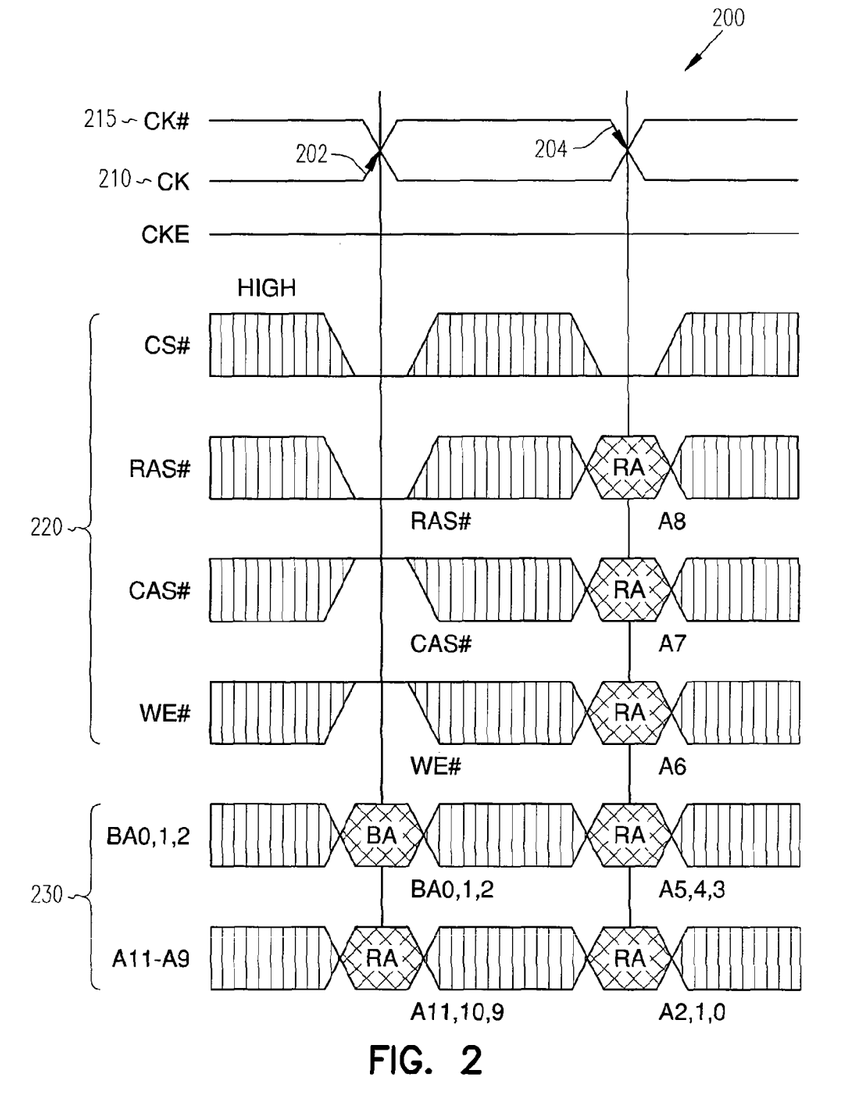
FIG. 2 is an exemplary embodiment of a timing diagram illustrating the initiating of the command and address signals to transfer data to and from a DRAM upon the rising and falling edges of a clock signal according to the present invention.

Referring now to FIG. 2, there is illustrated an example timing diagram 200 of initiating command and address signals by a controller to an integrated circuit memory device according to the present invention. As shown in FIG. 2, the command signals 220, such as CS#, RAS#, CAS#, and WE# and address signals 230, such as BA0~2 and A0~11 are initiated by the controller during both rising and falling edges 202 and 204 of a timing cycle of a timing signal 210 to increase the transfer rate of the command and address signals during the timing cycle. In some embodiments, the timing cycle of the timing signal is a clock cycle in a clock signal (CK). In these embodiments, the rising and falling edges 202 and 204 comprise transition from a logic level "zero" to a logic level "one" and transition from the logic level "one" to the logic level "zero", respectively.

Also in these embodiments, the controller can be a device, such as a central processing unit (CPU), a graphics processing unit (GPU), a processor, and/or a dynamic random access memory (DRAM) controller. In these embodiments, the integrated circuit memory device is a DRAM device. It can be seen from FIG. 2 that by sending the command and address signal upon both the rising and falling edges of a clock cycle the number of command and address signals sent during a clock cycle can be significantly more than the conventional technique described-above with reference to FIG. 1. It can be envisioned that by increasing the sending of the number of command and address signals in a clock cycle, the number of required command and address pins can be considerably reduced to achieve a higher packaging density in a DRAM.

The clock signal (CK#) 215 is an inverse of the clock signal (CK) 210 shown in FIG. 2. Again, it can be envisioned that by initiating the command and address signals during the rising and falling edges of CK#215, similar to initiating the command and address signals during the rising and falling edges of CK 210 as described-above, the transfer rate of the command and address signals 220 and 230 sent during the clock cycle can be increased.

Figure 3:
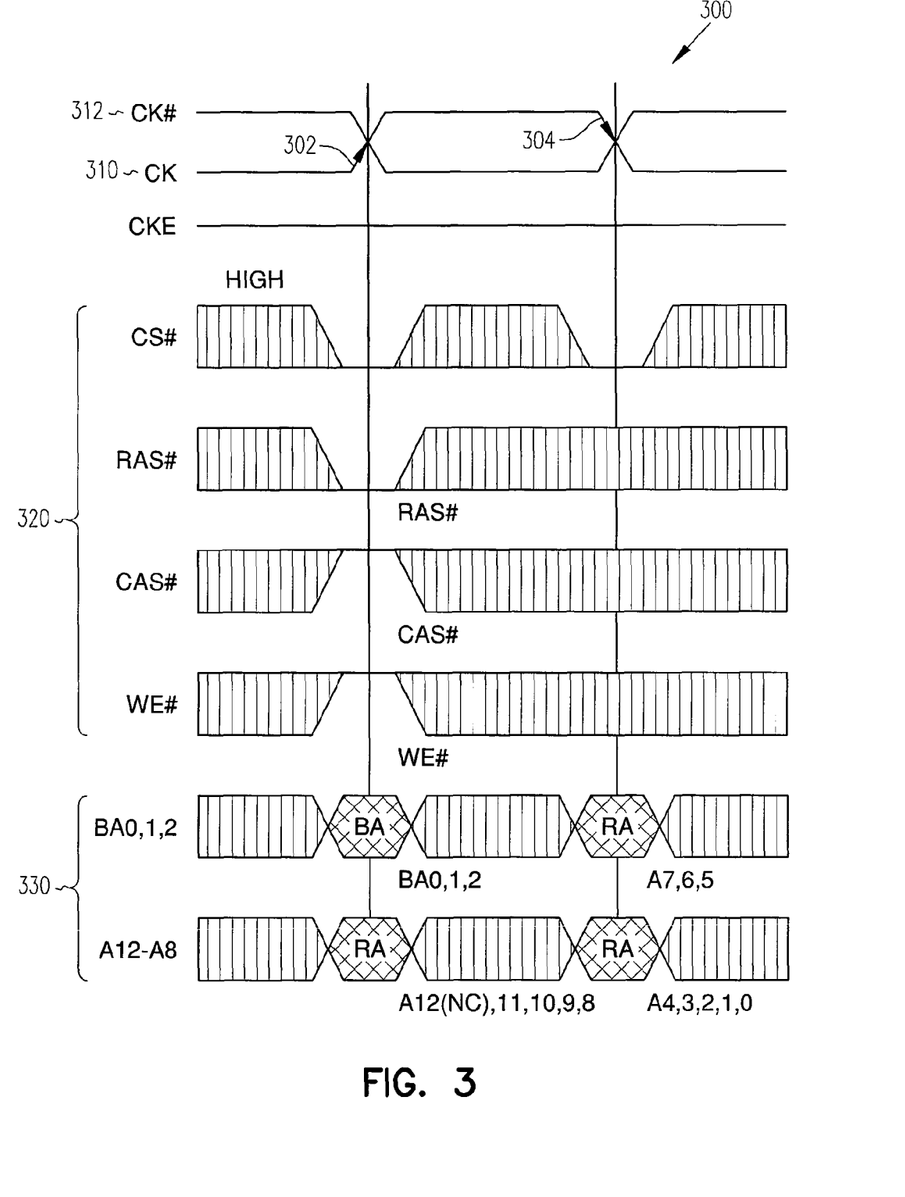
FIG. 3 is another exemplary embodiment of a timing diagram illustrating the initiating of the command and address signals to transfer data to and from a DRAM upon the rising and falling edges of a clock signal according to the present invention.
Figure 4:
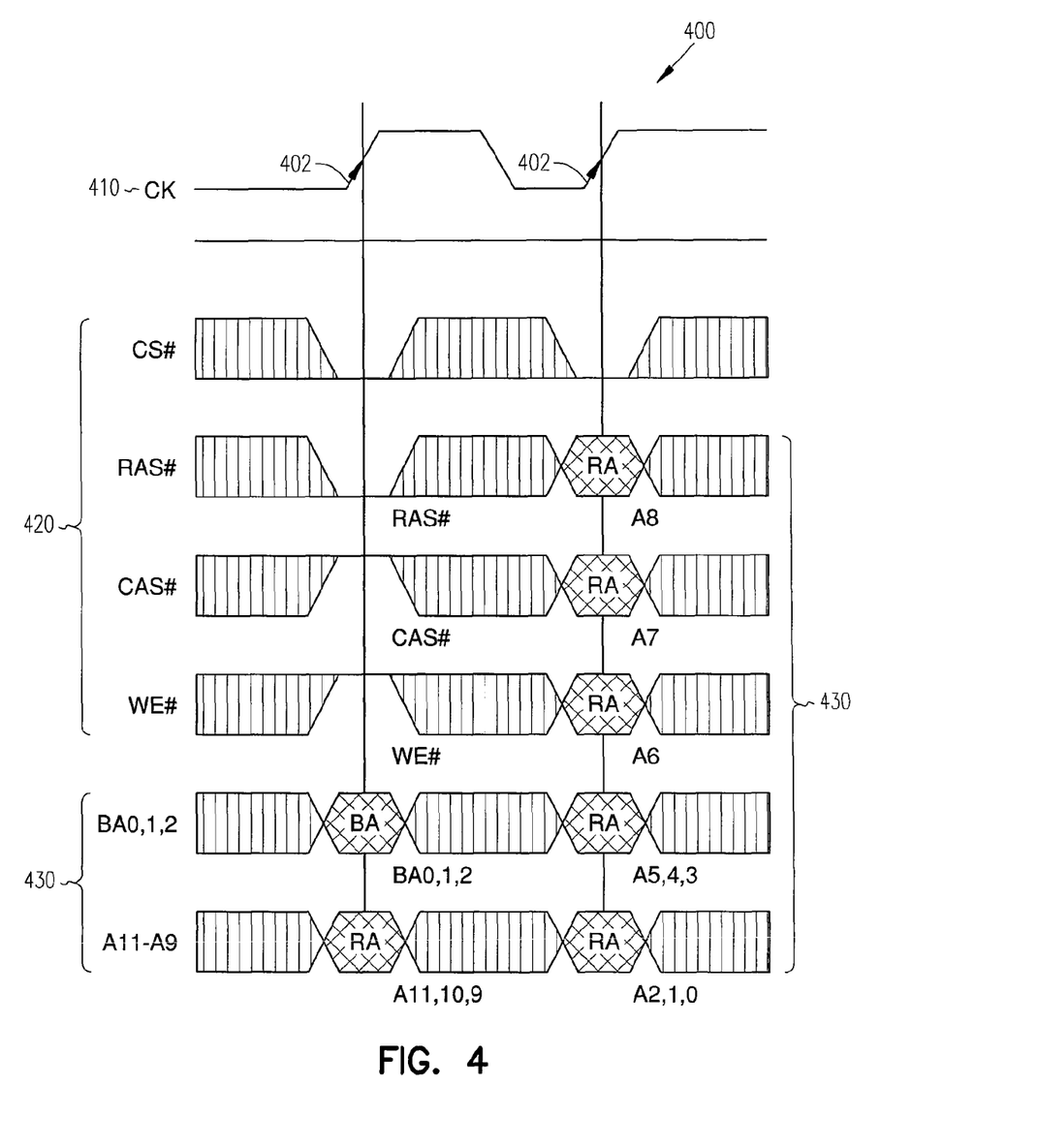
FIG. 4 is another exemplary embodiment of a timing diagram illustrating the initiating of the command and address signals to transfer data to and from a DRAM upon two substantially consecutive rising edges of a clock signal according to the present invention.

Referring now to FIG. 3, there is illustrated another example timing diagram 300 of initiating command and address signals by a controller to an integrated circuit memory device according to the present invention. As shown in FIG. 3, the command signals 320, such as CS#, RAS#, CAS#, and WE# and address signals 330, such as BA0~2 and A12~8 are initiated by the controller during a rising edge 302 of a clock cycle of a CK 310. In addition, the address signals, such as A0~7 are initiated during a falling edge 304 of the clock cycle of the CK 310 to increase the transfer rate of the command and address signals during the clock cycle for a given number of command and address pins in a DRAM device. Again it can be envisioned that using an inverse clock signal (CK#) 312 shown in FIG. 3 and initiating command and address signals as described-above can also increase the transfer rate of the command and address signals 320 and 330 sent by the controller during the clock cycle Referring now to FIG. 4, there is illustrated an example timing diagram 400 of initiating command and address signals by a controller to an integrated circuit memory device according to the present invention. As shown in FIG. 4, the command signals 420, such as CS#, RAS#, CAS#, and WE# and address signals 430, such as BA0~2 and A0~11 are initiated by the controller during two substantially consecutive rising edges 402 of a CK 410 to increase the transfer rate of the command and address signals during the two substantially consecutive cycles. The transfer rate of the command and address signals achieved by using this method 400 is lower than the transfer rate achieved with the method 200 described-above with reference to FIG. 2. Because, the method 400 essentially requires one additional clock cycle to complete sending all of the command and address signals 420 and 430. But, in the GHz clock frequency era, adding one additional clock cycle to send the command and address signals 420 and 430 does not significantly lower the transfer rates.

Figure 5:
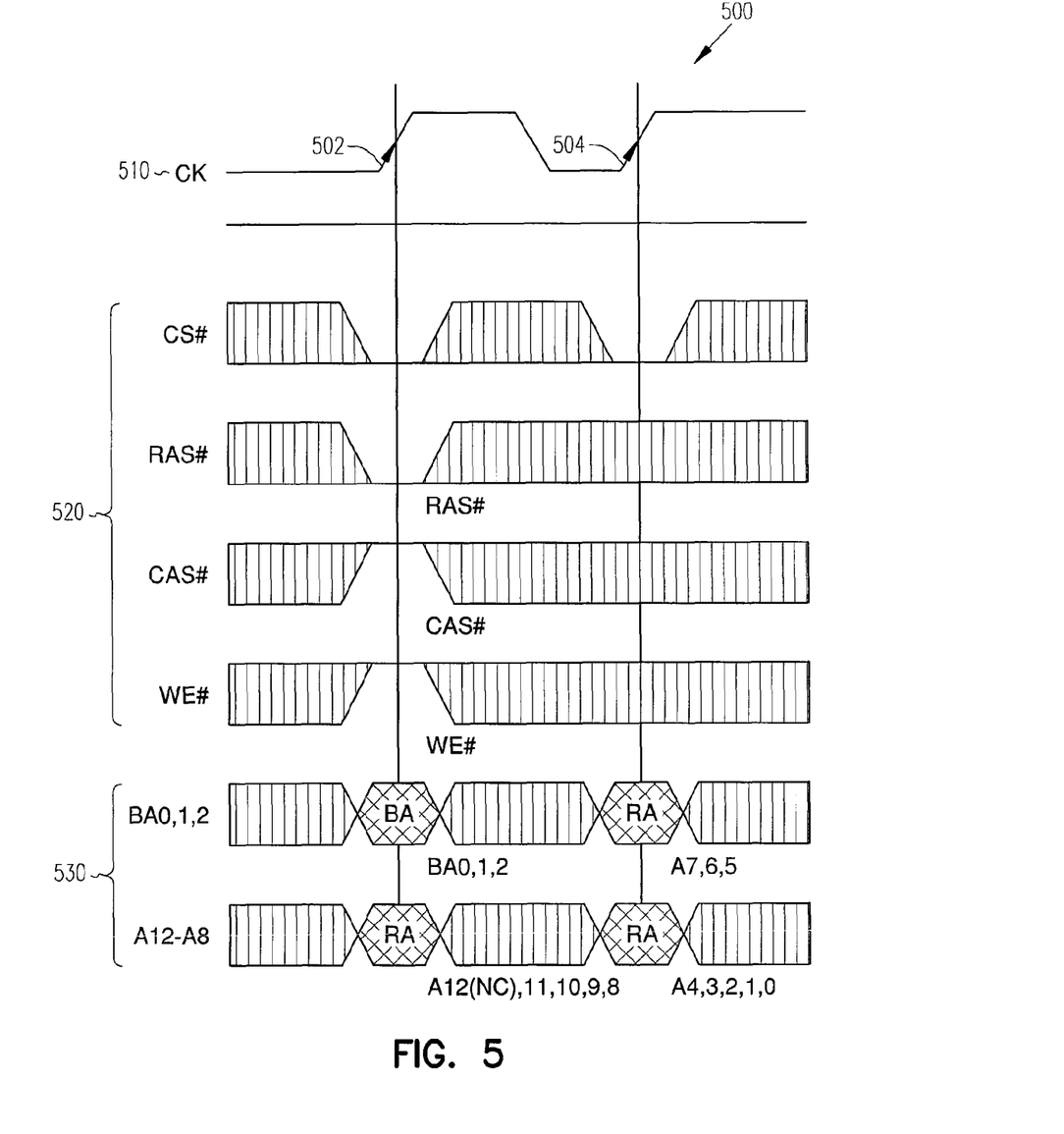
FIG. 5 is another exemplary embodiment of a timing diagram illustrating the initiating of the command and address signals to transfer data to and from a DRAM upon the two substantially consecutive rising edges of a clock signal according to the present invention.

Referring now to FIG. 5, there is illustrated another example timing diagram 500 of initiating command and address signals by a controller to an integrated circuit memory device according to the present invention. As shown in FIG. 5, the command signals 520, such as CS#, RAS#, CAS#, and WE# and address signals 530, such as BA0~2 and A11~9 are initiated by the controller during a rising edge 502 of a clock cycle of a CK 510. In addition, the address signals, such as A0~8 are initiated during a rising edge 504 of a substantially subsequent clock cycle of the CK 510 to increase the transfer rate of the command and address signals during two substantially subsequent clock cycles for a given number of command and address pins in an integrated circuit memory device. Again, it can be envisioned that an inverse of the CK 510 can also be used, as described-above, to increase the transfer rate of the command and address signals sent during the clock cycle. Again, it can also be seen that in the GHz range, adding one additional clock cycle to send the address signals 530 does not significantly lower the transfer rates of the command and address signals between the controller and one or more integrated circuit memory devices. The hatched state shown in FIGS. 1-5 for the command and address signals indicate that the signals must be held in one state so they may be read. The signal portion marked with vertical lines indicate that the signals may be in any state since they are not being read during that time period.

Figure 6:
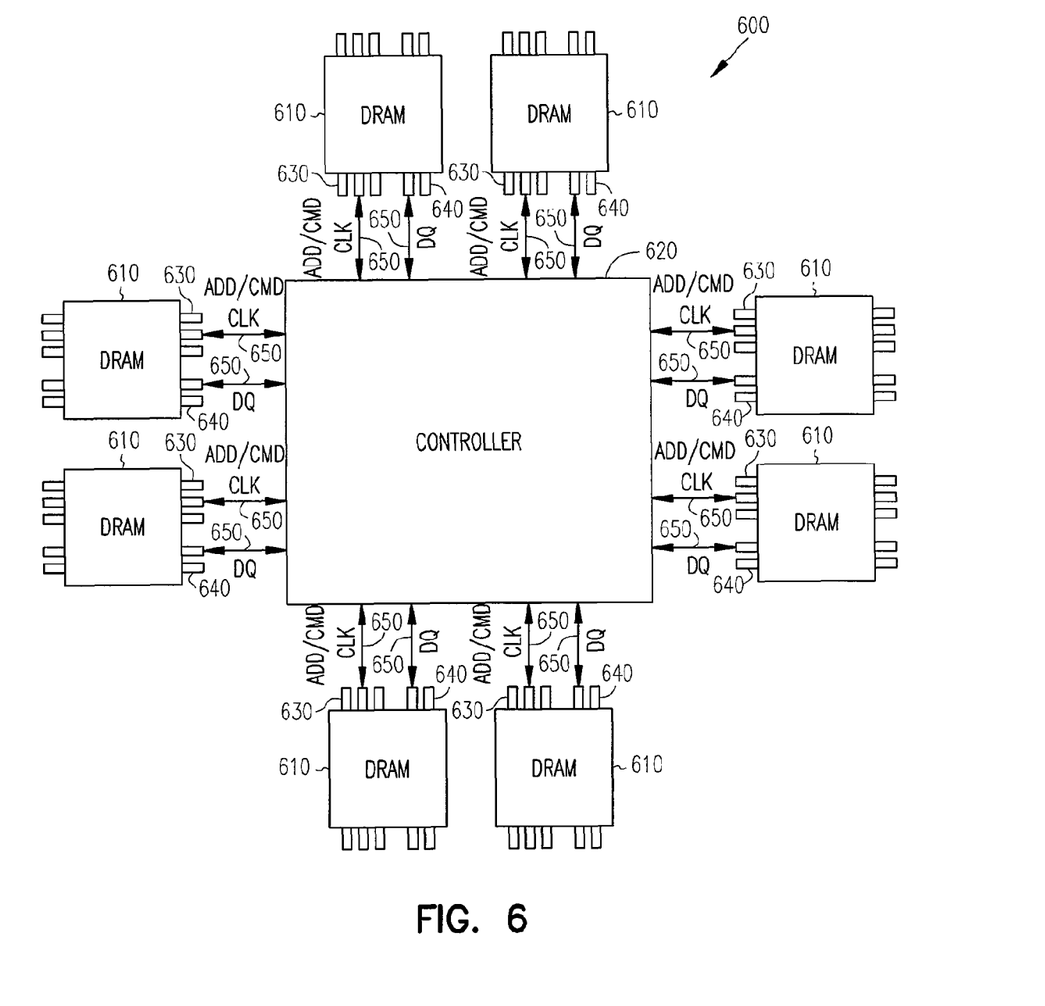
FIG. 6 is a block diagram illustrating the interconnections between a controller and multiple DRAMs according to one example embodiment of the present invention.

Referring now to FIG. 6, there is illustrated an example embodiment of a memory circuit 600 according to the present invention. The memory circuit 600 includes one or more DRAMs 610. Each of the DRAMs 610 includes multiple data pins 640 and multiple command and address pins 630. The memory circuit 600 further includes a controller 620 coupled to the one or more DRAMs 610 via the data pins 640 and the command and address pins 630. In some embodiments, the controller is a device, such as a CPU, a GPU, a processor, and a DRAM controller. Also in these embodiments, the DRAMs can be any integrated circuit memory devices, such as flash memory device, a volatile memory device, a non-volatile memory device, a static random access memory (SRAM) device, and/or a static memory device. In some embodiments, the multiple command and address pins 630 are coupled to the controller 620 through a coupling medium 650, such as input/output interface and/or a bus.

In operation, the controller 620 sends command and address signals to each integrated circuit memory device 610 via the associated multiple command and address pins 630, respectively, during a clock cycle of a clock signal so as to increase the transfer rate of the command and address signals during the clock cycle. This is accomplished by sending a higher number of command and address signals than available number of command and address pins 630 in each integrated circuit memory device 610.

In some embodiments, the controller 620 sends the command and address signals upon both rising and falling edges of a clock cycle when transferring data to and from each integrated circuit memory device 610 to increase transfer rate of the command and address signals within the clock cycle for a given number of the command and address pins 630 in each integrated circuit memory device 610. In other embodiments, the controller 620 sends the command and address signals upon a rising edge of a clock cycle and further sends remaining address signals upon a falling edge of the clock cycle when transferring the data to and from the integrated circuit memory device 610.

In some embodiments, the controller 620 sends the command and address signals to each integrated circuit memory device 610 via its associated multiple command and address pins 630, respectively, upon two substantially consecutive rising edges of a clock signal to increase transfer rate of the command and address signals. In other embodiments, the controller 620 sends the command and address signals to each integrated circuit memory device 610 via its associated multiple command and address pins 630, respectively, upon a rising edge of a clock cycle in a clock signal. Further, the controller 620 sends the address signals upon a rising edge of a substantially subsequent clock cycle to each integrated circuit memory device 610 via its associated multiple command and address pins 630, respectively, to increase transfer rate of the command and address signals to each integrated circuit memory device 610 in the two substantially consecutive clock cycles. In the above described embodiments, each of the integrated circuit memory devices 610 perform the memory command in response to receiving the set of command and address signals. The advantages in using the above techniques to send command and address signals are described-above in more detail with reference to FIGS. 2-5.

Figure 7:
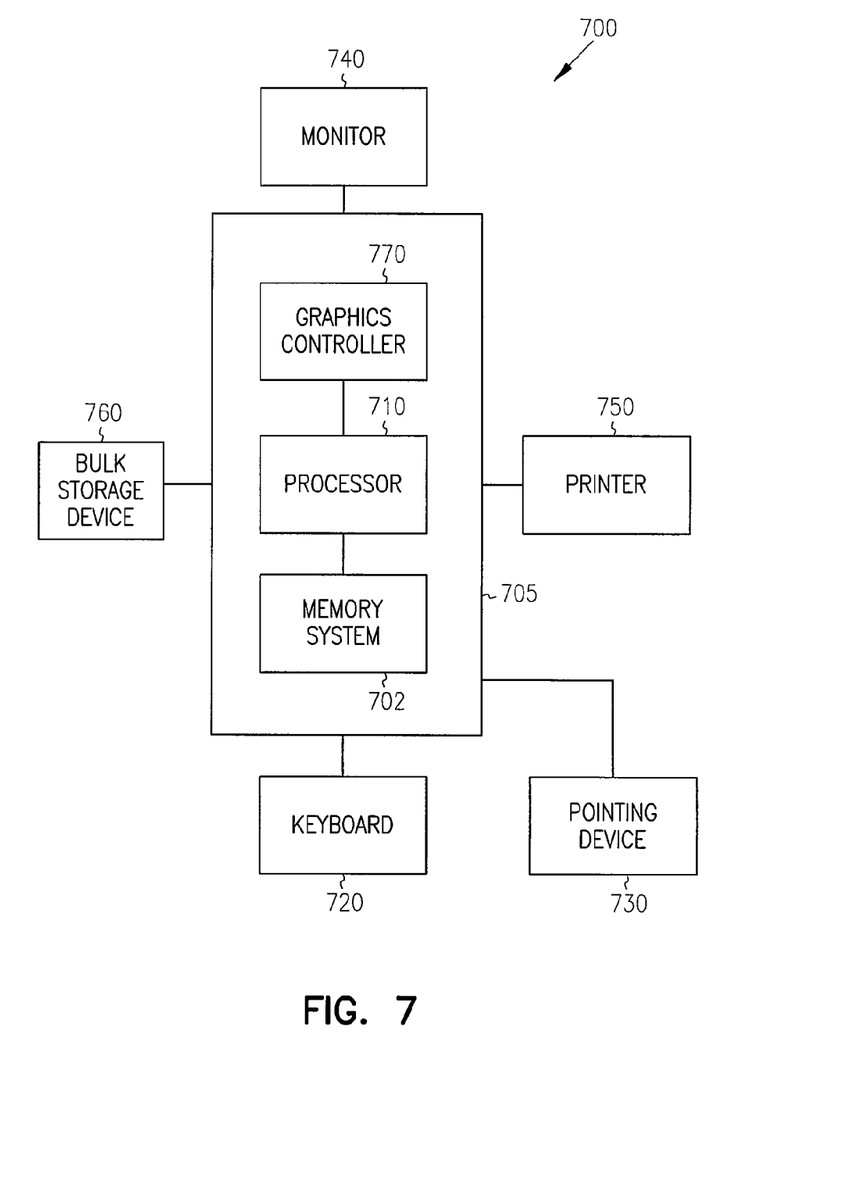
FIG. 7 is a block diagram of an exemplary computer system.

FIG. 7 is a block diagram of a system according to one embodiment of the present invention. Computer system 700 contains a processor 710 and a memory system 702 housed in a computer unit 705. Computer system 700 is but one example of an electronic system containing another electronic system, e.g., memory system 702, as a subcomponent. The memory system 702 includes a memory device that includes a multichip module as discussed in various embodiments of the present invention. Computer system 700 optionally contains user interface components. These user interface components include a keyboard 720, a pointing device 730, a monitor 740, a printer 750, and a bulk storage device 760. It will be appreciated that other components are often associated with computer system 700 such as modems, device driver cards, additional storage devices, etc. It will further be appreciated that the processor 710 and memory system 702 of computer system 700 can be incorporated on a single integrated circuit. Such single-package processing units reduce the communication time between the processor and the memory circuit. Any of these components of the system may contain a memory controller to initiate command and address signals to retrieve data from a memory device according to the present invention. This is particularly true of graphics subsystem 770 of FIG. 7 utilizing SGRAM that includes a solid film formed as discussed in various embodiments of the present invention.

Figure 8:
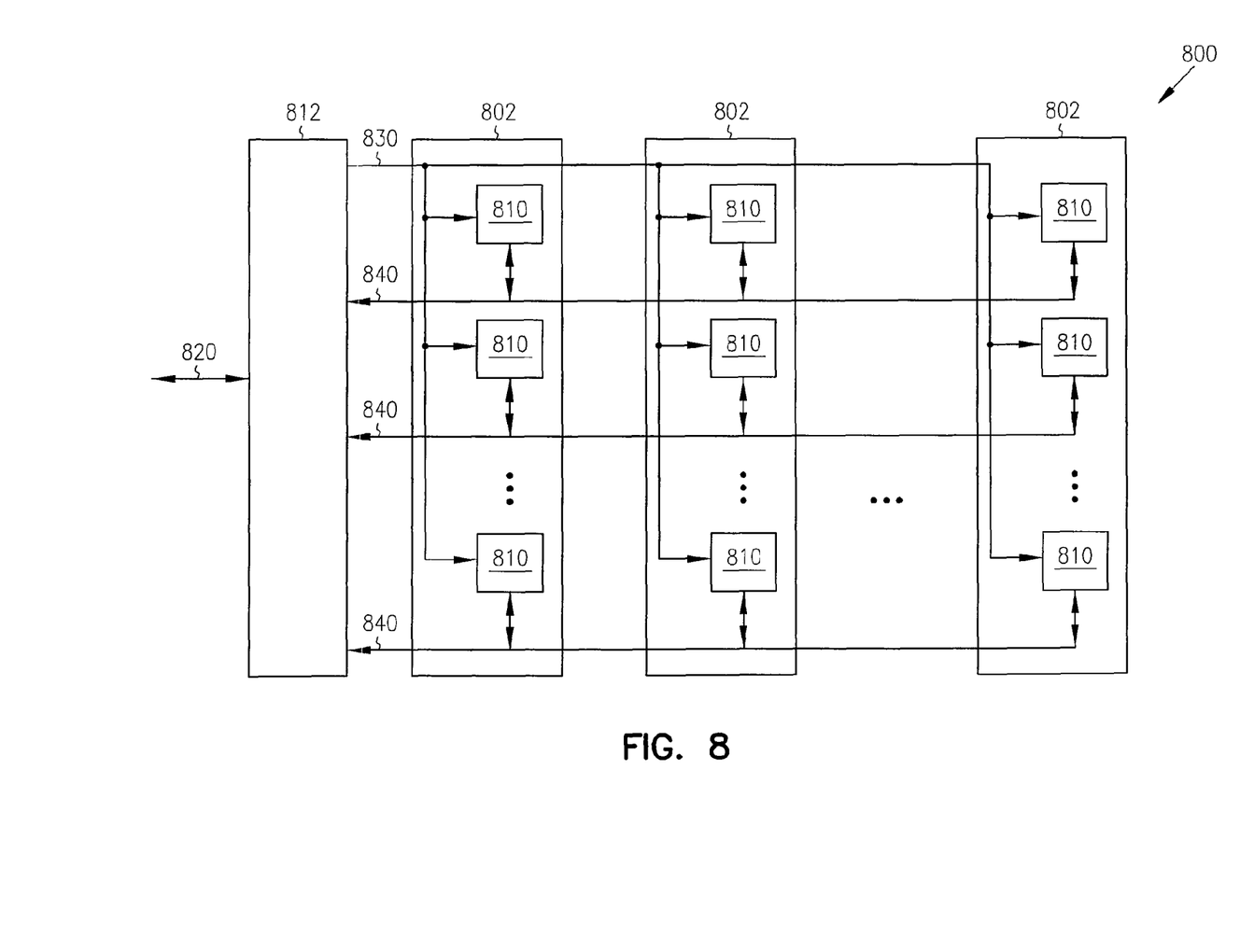
FIG. 8 is a block diagram of an exemplary memory system.

FIG. 8 is a block diagram of a system according to one embodiment of the present invention. Memory system 800 contains one or more multichip modules 802 and a memory controller 812. Each memory module 802 includes at least one memory device 810. Memory controller 812 provides and controls a bidirectional interface between memory system 800 and an external system bus 820. Memory system 800 accepts a command signal from the external bus 820 and relays it to the one or more memory modules 802 on a command link 830. Memory system 800 provides for data input and data output between the one or more memory modules 802 and external system bus 820 on data links 840. At least one of the memory devices 810 includes the DRAM controller to initiate command and address signals to retrieve data from one or more DRAMs according to the present matter.

Figure 9:
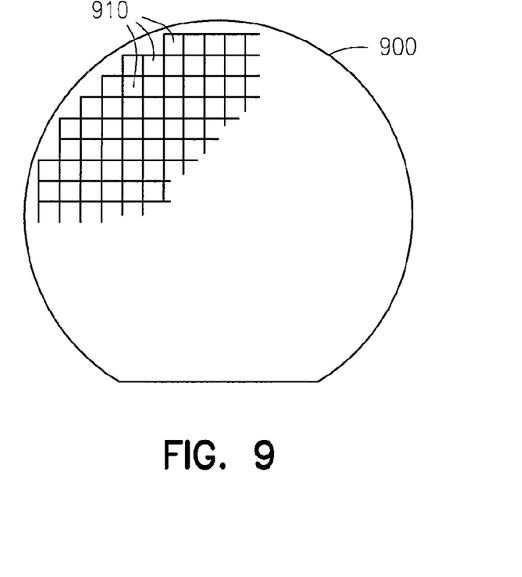
FIG. 9 is an elevational view of a substrate containing semiconductor dies.

With reference to FIG. 9, in one embodiment, a semiconductor die 910 is produced from a silicon wafer 900. A die is an individual pattern, typically rectangular, on a substrate that contains circuitry to perform a specific function. A semiconductor wafer will typically contain a repeated pattern of such dies containing the same functionality. Die 910 may contain multichip modules, as discussed above. Die 910 may further contain additional circuitry to extend to such complex devices as a monolithic processor with multiple functionality. Die 910 includes a DRAM controller coupled to one or more DRAMs as discussed in various embodiments of the present invention.

CONCLUSION

The present invention provides techniques to send command and address signals on both the rising and falling edges and/or on two consecutive rising or falling edges of a clock cycle (timing signal), thereby essentially reducing the number of command and address pins required by the DRAMs.

In one aspect, the invention provides techniques for reducing the number of command and address pins required in a DRAM. In this aspect, the invention includes sending command and address signals to one or more DRAMs to transfer data to and from the DRAMs upon both the rising and falling edges of a clock cycle. In accordance with another aspect of the present invention, a technique for reducing the number of command and address pins required on a DRAM includes sending the command and address signals on the first edge of a clock cycle and further sending address signals on the following edge of the clock cycle.

In accordance with yet another aspect of the present invention, a technique for reducing the number of required command and address pins on a DRAM includes sending the command and address signals on two consecutive rising edges (or falling edges) of a clock signal. In accordance with yet another aspect of the present invention, a technique for reducing the number of required command and address pins on a DRAM includes sending the command and address signals on a rising edge of a clock cycle and further sending the address signals on a subsequent rising edge of the clock cycle.

Additional advantages and features of the present invention will be more apparent from the detailed description and accompanying drawings, which illustrate preferred embodiments of the invention.

The above description illustrates preferred embodiments, which achieve the features and advantages of the present invention. It is not intended that the present invention be limited to the illustrated embodiments. Modifications and substitutions to specific process conditions and structures can be made without departing from the spirit and scope of the present invention. Accordingly, the invention is not to be considered as being limited by the foregoing description and drawings, but is only limited by the scope of the appended claims.

The invention claimed is:

1. A method of operating a memory device, the method comprising:
   receiving a memory command within a single clock cycle, wherein the memory command includes a command and an address, and wherein the receiving the memory command includes:
      receiving the command and a first portion of the address on a number of pins in relation to a first edge of a clock pulse of the single clock cycle; and
      receiving a second portion of the address on the number of pins in relation to a second edge of the clock pulse, wherein the receiving the second portion of the address includes using at least a portion of the number of pins used to receive the command,
   wherein the command includes a plurality of command signals,
   wherein the address includes a plurality of address signals,
   wherein the sum of the plurality of command signals and the plurality of address signals is greater than the number of pins; and
   wherein the number of pins used to receive the command includes a pin that is free from receiving any one of address signals included in the second portion of the address.

2. The method of claim 1, further comprising:
   performing the memory command, in the memory device, in response to receiving the command and the address within the single clock cycle.

3. The method of claim 1, wherein the operating a memory device includes operating a DRAM memory device.

4. The method of claim 1, wherein the first edge includes a rising edge, the rising edge including a transition from logic level "zero" to logic level "one", and wherein the second edge includes a falling edge, the falling edge including a transition from logic level "one" to logic level "zero".

5. The method of claim 1, wherein receiving the command and the address includes receiving the command and the address from an external controller.

6. The method of claim 5, wherein the receiving from the external controller includes receiving from at least one of a central processing unit (CPU), a graphics processing unit (GPU), or a processor.

7. The method of claim 1, wherein the pin, that is free from receiving any one of the address signals included in the second portion of the address, is a CS# signal of the command signals.

8. A method of operating a memory controller, the method comprising:
   sending a memory command within a single clock cycle, wherein the memory command includes a command and an address, wherein the command includes a plurality of command signals, wherein the address includes a plurality of first address signals and a plurality of second address signals, and wherein the sending the memory command includes:
      sending a plurality of command signals to a plurality of first pins of the a memory device, and the plurality of first address signals to a plurality of second pins of the memory device in relation to a first edge of a clock pulse of the sib clock cycle; and
      sending a first part of the plurality of second address signals to a portion of a plurality of first pins of the memory device and a second part of the plurality of second address signals to a plurality of second pins of the memory device in relation to a second edge of the single clock pulse,
   wherein the plurality of first pins of the memory device includes a pin that is free from receiving any one of the plurality of second address signals, and
   wherein the sum of the plurality of command signals and the plurality of first and second address signals is greater than the number of pins.

9. The method of claim 8, further comprising:
   performing a memory command, in the memory device, in response to receiving the command and the address from the memory controller.

10. The method of claim 8, wherein the first edge includes a rising edge, the rising edge including a transition from logic level "zero" to logic level "one", and wherein the second edge includes a falling edge, the falling edge including a transition from logic level "one" to logic level "zero".

11. The method of claim 8, wherein the pin, that is free from receiving any one of the plurality of second address signals, is a CS# signal of the command signals.

12. A memory device comprising:
   a set of first command pins; and
   a set of second address pins; and
   wherein the memory device is configured to receive a first portion of a word in relation to a first edge of a clock pulse of a plurality of clock pulses, wherein the first portion of the word comprises a set of command signals and a first subset of address signals, wherein the set of first pins are configured to receive the set of command signals and the set of second pins are configured to receive the first subset of address signals, wherein the memory device is configured to receive a second portion of the word in relation to a second edge of the clock pulse, wherein the second portion of the word comprises a second subset of address signals, wherein the set of first pins are configured to receive at least a portion of the second subset of address signals, wherein at least one pin of the set of the first pins is free from receiving any one of the second subset of address signals, and wherein the set of the second pins are configured to receive a remaining portion of the second subset of address signals; and
   wherein the memory device is configured to perform a memory command in response to receiving the command signals and the address signals within a single clock cycle, the single clock cycle including the first edge of the clock pulse and the second edge of the clock pulse.

13. The memory device of claim 12, including a controller configured to send the first portion of the word in relation to the first edge of the clock pulse and configured to send the second portion of the word in relation to the second edge of the clock pulse.

14. The memory device of claim 13, wherein the controller comprises at least one of a central processing unit (CPU), a graphics processing unit (GPU), or a processor.

15. The method of claim 12, wherein at least one of the set of the first pins is a CS# signal of the command signals.

16. An apparatus comprising:
   a controller configured to send a memory command in a single clock cycle, wherein the controller is configured to send a first portion of the memory command in relation to a first edge of the clock cycle, wherein the first portion of the memory command comprises a set of command signals and a first subset of address signals, wherein the controller is configured to send the set of command signals to command pins of a memory device and to send the first subset of address signals to address pins of the memory device, wherein the controller is configured to send a second portion of the memory command in relation to a second edge of the clock cycle, wherein the second portion of the memory command comprises a second subset of the address signals, and wherein the controller is configured to send the second subset of the address signals to a portion of the command pins and to the address pins of the memory device, wherein the command pins includes a pin that is free from receiving any one of the address signals.

17. The apparatus of claim 16, wherein the controller includes at least one of a central processing unit (CPU), a graphics processing unit (GPU), or a processor.

18. The method of claim 16, wherein the pin, that is free from receiving any one of the address signals, is a CS# signal of the command signals.

19. A method of operating a memory device, the method comprising:
  receiving a memory command within a single clock cycle, wherein the memory command includes a command and an address, wherein the command includes a plurality of command signals, wherein the address includes first and second portions, and wherein the receiving the memory command includes:
    receiving the command and the first portion of the address in relation to a first edge of a clock pulse of the single clock cycle; and
    receiving the second portion of the address in relation to a second edge of the clock pulse of the single clock cycle, and
    wherein the receiving the second portion of the address is carried out in a condition that at least one of pins of the memory device, that are used to receive the command signals in relation to the first edge of the clock pulse of the single clock cycle, is configured to receive information that is irrelevant to the second portion of the address in relation to the second edge of the clock pulse of the single clock cycle.

20. A method of operating a memory controller, the method comprising:
  sending a memory command within a single clock cycle, wherein the memory command includes a command and an address, wherein the command includes a plurality of command signals, wherein the address includes first and second portions, and wherein the sending the memory command includes:
    sending a memory device the command and the first portion of the address in relation to a first edge of a clock pulse of the single clock cycle; and
    sending the memory device the second portion of the address in relation to a second edge of the clock pulse of the single clock cycle, and
    wherein the sending the memory device the second portion of the address is carried out in a condition that the memory controller is configured to provide at least one of the pins of the memory device that are used to receive the command signals in relation to the first edge of the clock pulse of the single clock cycle, with information that is irrelevant to the second portion of the address in relation to the second edge of the clock pulse of the single clock cycle.

* * * * *